United States Patent
Kim

[11] Patent Number: 5,963,856
[45] Date of Patent: Oct. 5, 1999

[54] WIRELESS RECEIVER INCLUDING TUNABLE RF BANDPASS FILTER

[75] Inventor: H. H. Kim, Holmdel Township, Monmouth County, N.J.

[73] Assignee: Lucent Technologies Inc, Murray Hill, N.J.

[21] Appl. No.: 08/778,921

[22] Filed: Jan. 3, 1997

[51] Int. Cl.⁶ ................................................. H04B 1/00
[52] U.S. Cl. ............................................ 455/307; 455/285
[58] Field of Search ........................... 455/180.1, 188.1, 455/193.1, 193.2, 302, 307, 314, 315, 324, 340, 339, 266, 285

[56] References Cited

U.S. PATENT DOCUMENTS

| | | | |
|---|---|---|---|
| 4,979,230 | 12/1990 | Marz | 455/324 |
| 5,212,817 | 5/1993 | Atkinson | 455/161.2 |
| 5,239,701 | 8/1993 | Ishii | 455/180.1 |
| 5,265,267 | 11/1993 | Martin et al. | 455/326 |
| 5,276,914 | 1/1994 | Ishizuka | 455/83 |
| 5,303,417 | 4/1994 | Laws | 455/324 |
| 5,519,890 | 5/1996 | Pinckley | 455/266 |
| 5,579,347 | 11/1996 | Lindquist et al. | 455/324 |
| 5,640,698 | 6/1997 | Shen et al. | 455/323 |
| 5,711,009 | 1/1998 | Law | 455/504 |

Primary Examiner—Reinhard J. Eisenzopf
Assistant Examiner—Makoto Aoki

[57] ABSTRACT

The wireless receiver band is divided into a plurality of smaller bands using a tunable duplexer to produce a first IF signal of a much lower frequency enabling better unwanted signal filtering using a filter of a certain Q.

16 Claims, 6 Drawing Sheets

TUNABLE ELLIPTIC BANDPASS FILTER

WIRELESS RECEIVER INCLUDING TUNABLE RF BANDPASS FILTER

TECHNICAL FIELD OF THE INVENTION

This invention relates to wireless receivers and, more particularly, to a wireless receiver including a tunable radio frequency (RF) bandpass filter at the receiver front-end to achieve down-conversion to a low 1st-Intermediate Frequency (IF).

BACKGROUND OF THE INVENTION

A super-heterodyne is a widely used and well-proven radio receiver architecture. It can sufficiently eliminate interfering signals while selecting the desired signal. Two or more local oscillators (LO) convert an RF input signal to two or more Intermediate Frequencies (IFs), where IF=LO−RF, before it reaches the baseband frequency. The first IF is much higher in frequency (usually at least twice) than the bandwidth of the RF hyperband (The hyperband consists of many channels. The receiver should be capable of selecting any one channel in the hyperband on command). For instance, a typical receiver for North American cellular band 869 to 894 MHz, i.e., 25 MHz wide, and has a first IF at higher than 50 MHz. A receiver for Personal Communication Services (PCS) 1930 to 1990 MHz band, i.e., 60 MHz wide, has a first IF at higher than 120 MHz. Such IFs ensure a sufficient removal of the spurious signals at LO+IF and at LO−½IF, the so called "half IF spurious response". After bandpass filtering, the signal at first IF is then down-converted to a lower second IF, typically around 450 KHz or 10.7 MHz for further filtering (channel selection). Then, the IF signal is demodulated to baseband, i.e., a center frequency of 0 Hz.

It is desirable to simplify the radio receiver design by eliminating the second IF and down-converting directly to baseband from first IF. However, this is not possible when the channels are narrow (say 30 kHz) and the IF is high enough to avoid the ½ IF spurious response and image frequency. The reason is that the ratio of 120 MHz to 30 kHz is 4000, and so a filter with a Q (quality factor) of 4000 and a center frequency of 120 MHz would be required for channel selection. Such a filter is expensive and extremely difficult to realize.

SUMMARY OF THE INVENTION

In accordance with the present invention, I have determined that if a received hypeband of cellular or PCS signal is divided into n smaller bands (sub-bands), the first IF can be of a much lower frequency. Using the cellular hyperband as an example, the effective RF band is 25/n MHz. Then, the first IF (at twice the effective RF band) is lowered to 2×25/n MHz for cellular. Using my method, an IF of 10.7 MHz would be high enough to avoid the ½ IF spurious response. Therefore, at this first IF, the bandpass filter with finite Q can do channel selection and sufficiently eliminate image (LO+ IF) and half IF (LO−½ IF) spurious signals. In our cellular example, the filter would then only have to have a Q of 360 (10.7 MHz/30 kHz) and center frequency of 10.7 MHz, such a filter is available at low cost.

Thus, in accordance with the present invention, a wireless receiver comprises a switched filter, operable under control of a control signal, for selecting one of a plurality of frequency bands within the bandwidth of a received modulated radio signal. A frequency synthesizer produces a local oscillator signal selected using the control signal. A mixer mixes the selected frequency band of the received modulated radio signal with the selected local oscillator signal to produce a modulated fixed intermediate frequency (IF) signal which is detected to recover a baseband signal.

DETAILED DESCRIPTION

In the following description, each item or block of each figure has a reference designation associated therewith, the first number of which refers to the figure in which that item is first located (e.g., 110 is located in FIG. 1).

Figure 1A:
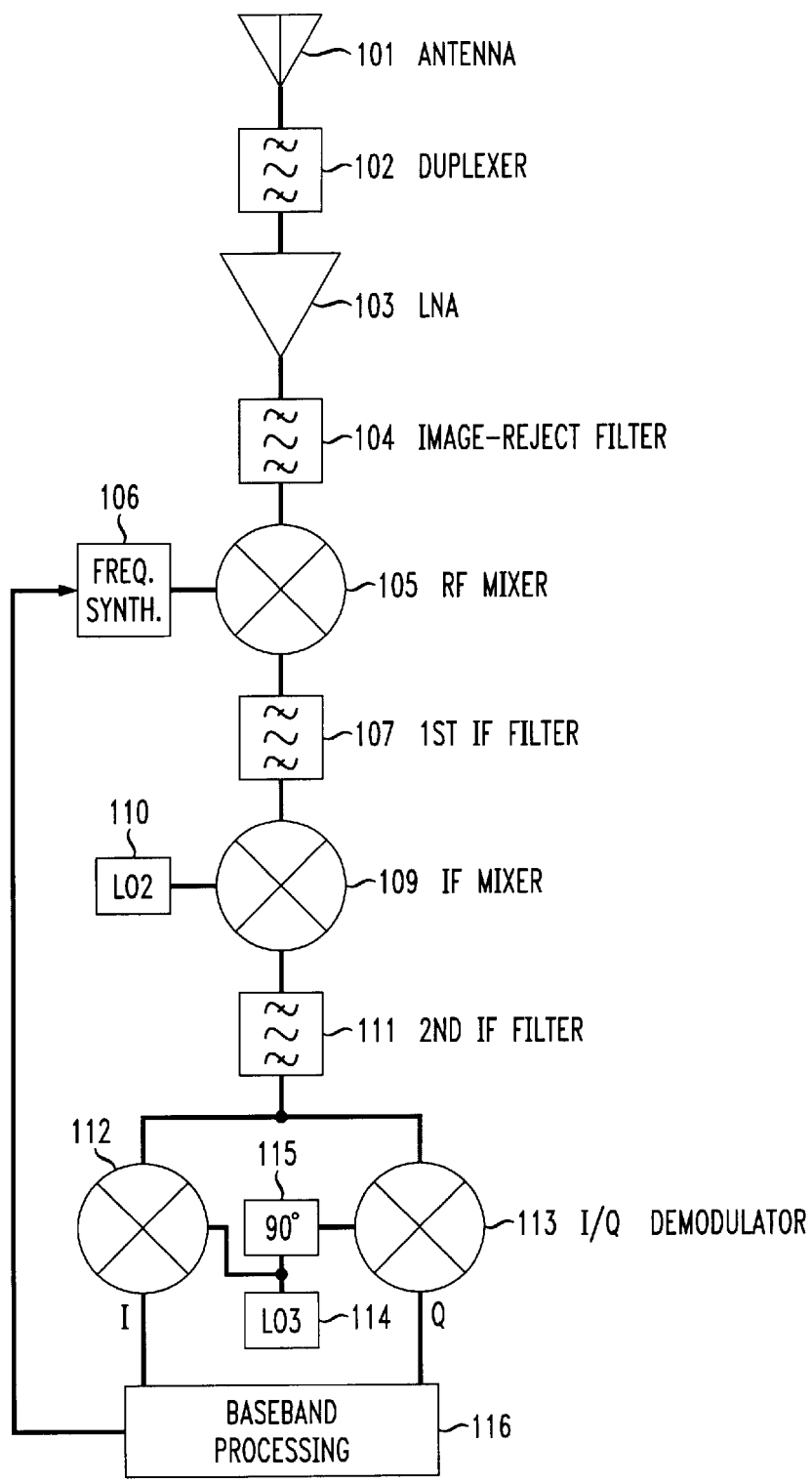
FIG. 1a shows an illustrative block diagram of a prior art cellular or PCS radio receiver and FIGS. 1b–1e show associated signal frequencies at different stages of the receiver.
Figure 1B:
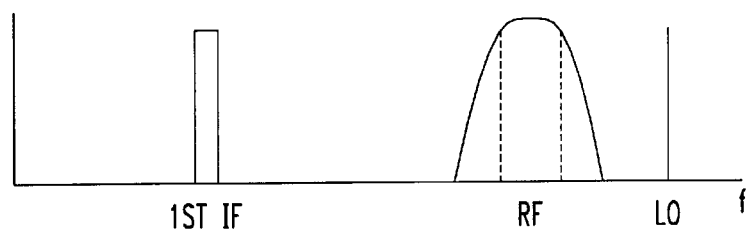
Figure 1C:
Figure 1D:
Figure 1E:

Shown in FIG. 1a is an illustrative block diagram of a prior art super-heterodyne type receiver which is used as a cellular ( e.g., 900 Mega Hertz (MHz)) or PCS (Personal Communication Services) radio receiver. An example of implementing such a radio receiver is shown in Koullias, I. A, et al., "A 900 MHz Transceiver Chip Set for Dual-Mode Cellular Radio Mobile Terminals," ISSCC Digest of Technical Papers, pp. 140–141, February 1993. The FIGS. 1b through 1e show associated signal frequencies at different stages of the receiver.

Since the present invention is an enhanced super-heterodyne receiver which utilizes some of the same elements of the prior art super-heterodyne receivers, a review of the general operation of such a super-heterodyne receiver provides a useful background for understanding the present invention.

The modulated cellular or PCS radio frequency (RF) signal is received at antenna 101 and then filtered by block filter 102. The block filter 102, typically has a bandpass frequency band of 25 MHz (for a North American cellular signal, 869–894 MHz, referred to as the 900 MHz band signal). The block filter 102, has a 60 MHz bandpass for a North American PCS signal, extending from 1930–1990 MHz. The output RF signal from filter 102 is then amplified by a low-noise preamplifier 103 (LNA) and filtered by an image-reject filter 104. The image-reject filter 104 eliminates spurious external signals at image frequencies to prevent them from interfering with the desired RF signal. An RF mixer 105 mixes the RF signal from image-reject filter 104 with a local-oscillator signal from frequency synthesizer 106.

The local-oscillator frequency is selected in frequency synthesizer 106 to produce a desired first intermediate-frequency (1st-IF) of about twice the bandwidth of the receiver band. The frequency synthesizer 106 is tunable to cover the entire frequency range of the receiver band. The selected local-oscillator frequency produces a desired 1st-IF of about twice the bandwidth of the Block filter 102. Thus, for example, for the 900 MHz cellular signal with a 25 MHz wide receive band (of the hand-set), the 1st-IF is at least 50 MHz or higher. Similarly, for the 1900 MHz PCS signal with 60 MHz wide receive band, the 1st-IF is at least 120 MHz or higher.

The 1st-IF signal is then filtered by bandpass filter 107 to eliminate undesired interfering signals from the 1st-IF signal band. After bandpass filtering by bandpass filter 107, the 1st-IF signal is downconverted by IF mixer 109 with a second local-oscillator signal from oscillator 110 (LO2). The IF mixer 109 produces a lower second IF (2nd-IF) signal. A typical 2nd-IF signal is 450 Kilo Hertz (kHz).

The 2nd-IF signal is filtered by a channel-select filter 111 and then demodulated to baseband I ("In" phase) and Q ("Quadrature" phase) signals. Demodulation is done in a conventional manner in I/Q demodulators 112 and 113, using signals from local oscillator 114 (LO3) and phase shifter 115. The output I and Q signals are processed in a baseband processing unit 114. The baseband processing unit 116 provides a control signal to synthesizer 106 for controlling the selection of the local oscillator frequency.

In accordance with the present invention, I propose a method and apparatus to implement a lower 1st. IF (intermediate frequency) radio receiver which makes the second IF unnecessary. According to the present invention, if a receive band of cellular or PCS band is divided into n smaller bands, the first IF can be much lower frequency. For instance, if we select only a 5 MHz band (i.e., n=5) instead of entire 25 MHz of cellular receive band, or a 10 MHz band instead of entire 60 MHz of PCS receive band, the first IF can be 10 MHz or 20 MHz, respectively. If such a receiver is implemented using an A/D converter to process the received signal for digital demodulation, advantageously, the A/D converter to handle such a 10 MHz or 20 MHz IF signal would require only a 20 or 40 MHz sampling frequency, which is feasible with today's technology.

Figure 2A:
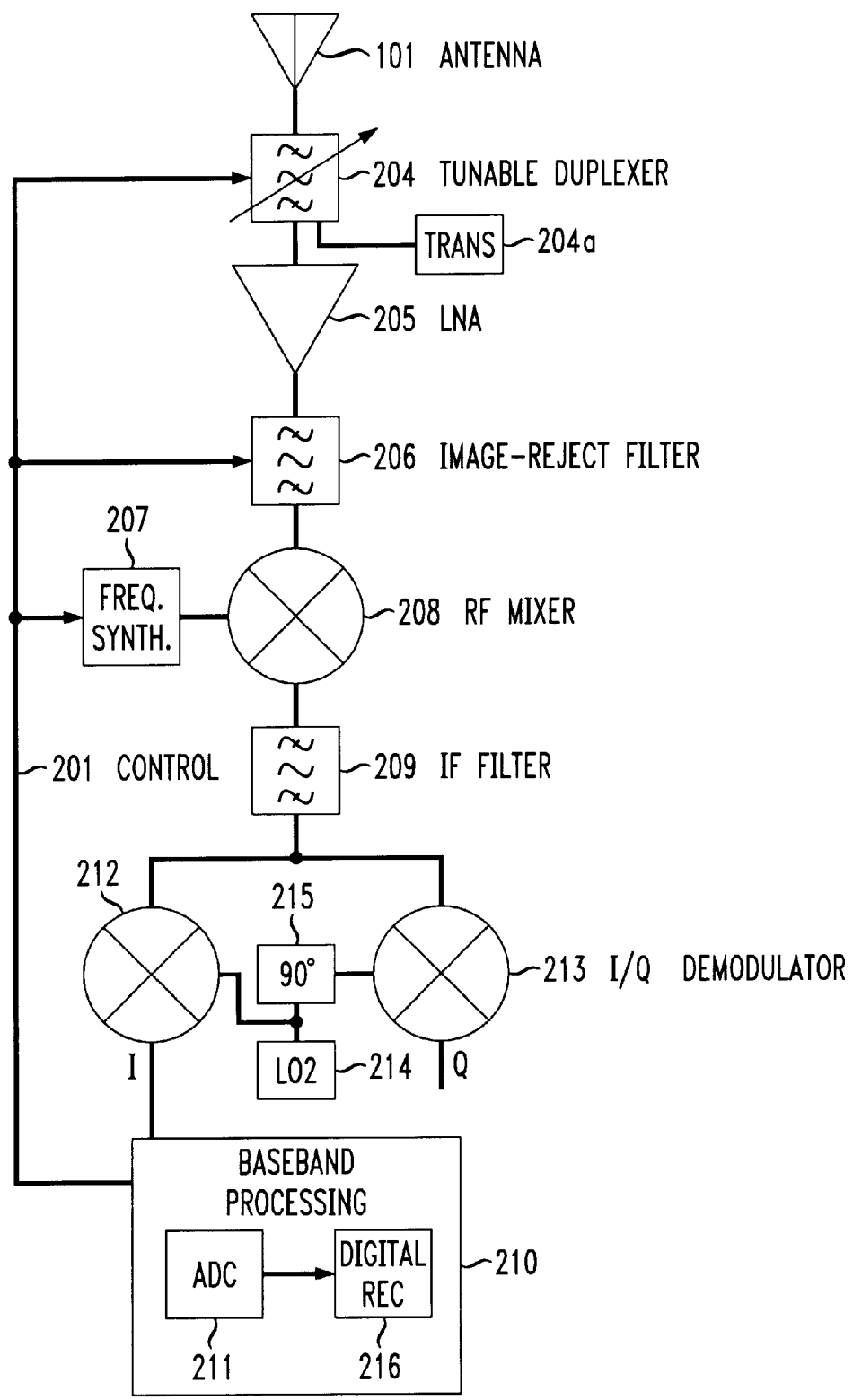
FIG. 2a shows an illustrative block diagram of a cellular or PCS radio receiver in accordance with the present invention and FIGS. 2b–2d show associated signal frequencies at different stages of the receiver.
Figure 2B:
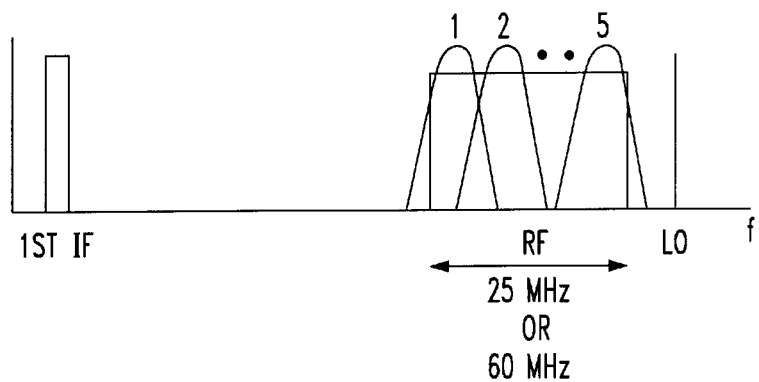
Figure 2C:
Figure 2D:

FIG. 2a shows an illustrative block diagram of a cellular or PCS radio receiver in accordance with the present invention and FIGS. 2b–2d show associated signal frequencies at different stages of the receiver. As previously described, antenna 101 receives the signal. In accordance with my invention, the wireless band is divided into a plurality of narrower bands using a duplexer 204 (also referred to herein as a tunable or switched filter). For example, for the 900 MHz cellular signal the 25 MHz band is divided into five 5 MHz bands (e.g., see FIG. 2b).

One method of selecting these narrower 5 MHz bands is to have multiple duplexers in parallel, a separate duplexer for each band, each of which can be switched to connect to the signal outputted from low-noise preamplifier 103. However, such an arrangement is a costly 30 solution, which would also increase the size of the receiver. Instead, I have made the duplexer 204 tunable. The duplexer 204 is a tunable or a switchable filter operable under control of the same control signal 201 from Baseband Processing unit 210 which is used to select the frequency of frequency synthesizer or tunable local oscillator 207.

If a higher insertion loss of the duplexer 204, due to higher Q (e.g., five times higher Q), is a concern, the tunable duplexer 204 can be substituted for by a block filter (e.g., 102) and the image-reject filter 206 can be made tunable. Moreover, if a switch rather than a duplexer is used as unit 204, the image-reject filter 206 can again be made tunable. In such an arrangement, the image-reject filter 206 is made tunable under control of control signal 201.

Additionally, if sufficient selectivity (e.g., greater than 60 dB) is achievable with the tunable duplexer 204, the image-reject filter (i.e., 206) before the RF mixer 208 can be eliminated In such an arrangement, the output of preamplifier 205 would connect directly to mixer 208. Alternatively, the tunable filter 206, with selectivity greater than 35 dB, can be implemented together with an mixer 208, having 25 dB of image signal rejection, thereby together forming an image-reject mixer 208 having the overall desired selectivity of 60 dB.

Using any of the above arrangements for a tunable duplexer 204 enables the use of a first IF signal having a much lower frequency, 10 MHz for our 900 MHz cellular signal example. To produce a constant 10 MHz IF signal, both the scanner frequency of the local oscillator (e.g., of the tunable duplexer 204 and the center frequency of the tunable duplexer 204 must be switched, in synchronism, through the different 5 MHz bands of the 25 MHz bandpass channel of the 900 MHz cellular signal. In conventional scheme, an Automatic Frequency Control (AFC) loop (not shown) in receiver 213 senses the correct frequency and the local oscillator frequency is adjusted accordingly by the frequency synthesizer 207 (LO1). The AFC generates the control signal 201 to control the frequency band selection of both the tunable duplexer 204 and the local oscillator frequency selection of frequency synthesizer 207. Consequently, for our example, the control signal 201 causes the frequency synthesizer 207 and tunable duplexer 204 to scan in synchronized 5 MHz frequency steps through the 25 MHz bandpass channel. The signals from the tunable duplexer 204 and frequency synthesizer 207 are then mixed in mixer 208 to produce the 10 MHz IF signal.

It should be noted that in a wireless transceiver, the tunable duplexer 204 may be shared or switched between the receiver unit and transmitter unit 204a, as shown in FIG. 2. Such a switched or shared operation of the duplexer 204 does not affect the operation of the present invention.

In a similar manner for the PCS system example, the 60 MHz bandpass channel may be divided into twelve 5 MHz bands which are switchably selected by tunable duplexer 204 in synchronism with the frequency selection of frequency synthesizer 207 to produce a 20 MHz IF 10 signal out of mixer 208.

In the PCS system example, if the 60 MHz bandpass channel is divided into twelve 5 MHz bands, rather than six 10 MHz bands, then a 10 MHz IF signal may be utilized.

One advantage obtained by maintaining the narrowed frequency bands at a constant value, e.g., 5 MHz, is that a fixed 10 MHz IF frequency can be utilized for both the 900 MHz cellular and PCS systems. Additionally it may also be used for other varieties of RF carrier signals. Such an arrangement has the advantage of enabling a single receiver hardware design to be used with any of a variety of RF carrier frequencies by changing only the number of narrowed frequency bands utilized. The number of frequency bands can then more readily be changed using a programmable dip-switch or under program control (e.g., by changes in Read Only Memory (ROM)).

The output 10 MHz IF signal from mixer 205 is then filtered by bandpass filter 209 to eliminate undesired interfering signals from the 10 MHz IF signal band. Thereafter, as previously described, the IF signal is demodulated to baseband I ("In" phase) and Q ("Quadrature" phase) signals. Demodulation is done in a conventional manner in I/O demodulators 212 and 213, using signals from local oscillator 214 (LO2) and phase shifter 215. Thereafter, baseband processing unit 210, which, illustratively, includes an Analog to Digital Converter (ADC) 211 and a digital receiver 216, recovers the baseband signal in a conventional manner.

Thus, my wireless RF receiver of FIG. 2 eliminates the 2nd-IF stage thereby enabling digital demodulation (or down-conversion to baseband) to be applied after the 1st IF stage.

Figure 3:
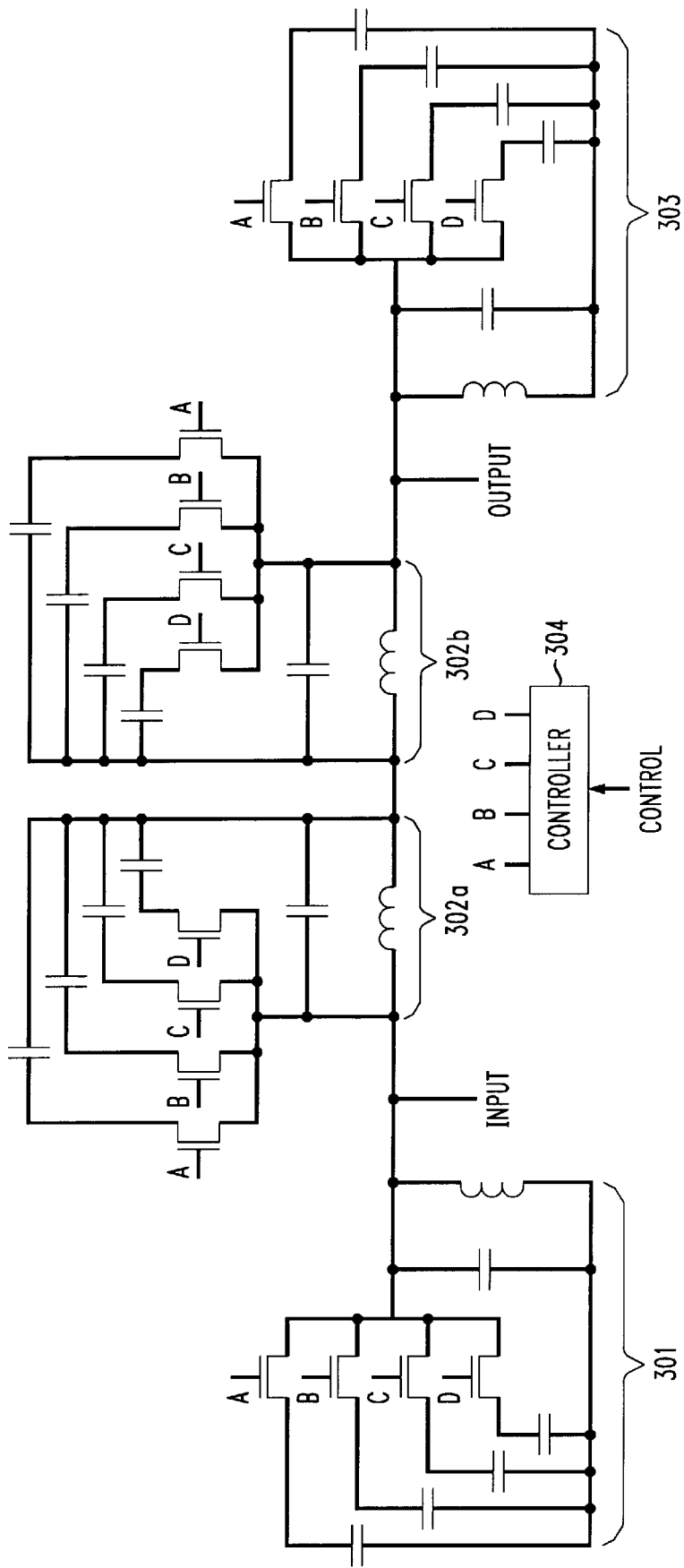
FIG. 3 shows an illustrative tunable elliptic bandpass filter for use as a switched-filter in FIG. 2.

The tunable filter 204 can be implemented with lumped elements and active switches as shown in FIG. 3. FIG. 3 shows an illustrative tunable elliptic bandpass filter for use as the tunable filter 204 of FIG. 2. The filter shown is a 3-order elliptic filter (pi section filter) including a first shunt branch 301, a series branch 302 and a second shunt branch 303. The first and second shunt branches are essentially identical. The first and second sections 302a and 302b of the series branch 302 are also essentially identical. The input to the filter is at the junction of shunt branch 301 and the first series section 302a, while the output of the filter is at the junction of shunt branch 303 and the second series section 302b. Each of the branches 301, 302a, 302b, and 303 includes a parallel tuned element including a common inductor across which one or more of four capacitors can be selectively switched into the circuit via MOS switches. These switched capacitors enable the bandpass frequency characteristic of the 3-order elliptic filter to be changed under control of signals A, B, C, and D. Controller 304 generates signals A, B, C, and D in response to a received control signal from receiver 213 of FIG. 2.

Illustrative characteristics of a 3-order elliptic filter of FIG. 3 which enables the selection of 6.25 MHz frequency bands, may have a 3-dB bandwidth of 12.5 MHz and stopband attenuation of about 35 dB at 12.5 MHz away from the center frequency. The center frequency can be tuned to 869, 875.25 881.5, 887.75, and 894 MHz by switching on appropriate parallel capacitors. The filter of FIG. 3 may be implemented with lumped L and C elements available in MCM (multi-chip module) technology. The MOS switches are designed in 0.35 $\mu$m (micrometer) technology. The MOS switches may illustratively be flip-chip mounted to the MCM filter chip.

While a multisection 3-order elliptic filter has been described for use with the invention, it should be understood that other well known single or multisection filter designs may be utilized. Thus, the switched filter may be implemented using a multiple section filter having at least one switchable section and selected from a group of multiple section filters including at least the previously-identified 3-order elliptic filter, a 3-order Butterworth filter, a 3-order Chebychev filter, or other 3-order filter type. Moreover, if desirable, the inductive element rather than the capacitor element of these filters can be made to be switchable by the switch element. Additionally, one or more of the filter sections can be made switchable.

Figure 4:
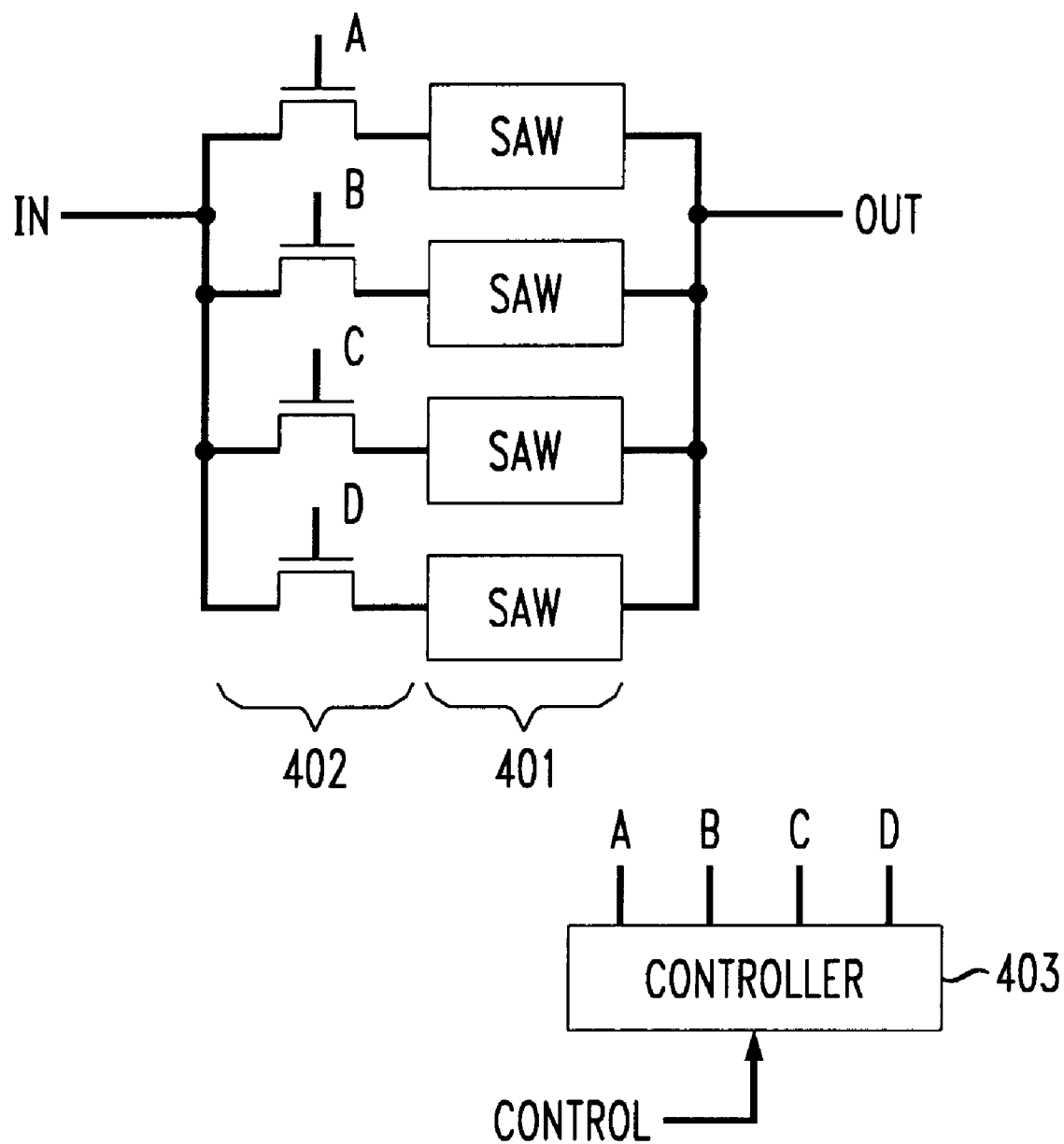
FIG. 4 shows a switched-filter implemented using a plurality of Surface Acoustic Wave (SAW) devices 401 switched by MOS switch devices 402, to provide the switched-filter function.

According to another aspect of the invention, the tunable filter 204, and/or the image-reject filter 206, of FIG. 2 may be implemented as shown in FIG. 4. As shown, a plurality of Surface Acoustic Wave (SAW) devices 401 may be switched by MOS switch devices 402, such as those shown in FIG. 3, to provide the switched-filter function of filter 204. Each of the individual SAW devices are tuned to a different one of the 5 MHz frequency bands. In response to a control signal controller 403 generates the filter select signals A, B, C, and D. The filter select signals enable an MOS switch 402 to connect the appropriate SAW device 401 between the input and output terminals of the tunable filter 204. One illustrative well known SAW device is described on page 220 of chapter 10, of the book entitled "Surface Acoustic Wave Devices and Their Signal Processing Applications", published by Academic Press in 1989.

Additionally, the switched filter, used in tunable duplexer 204 and/or image-reject filter 206, may also be implemented using any of group of well known technologies including a plurality of switched ceramic filter devices, a plurality of switched dielectric filter devices, and/or a plurality of switched thin film resonator devices. Moreover, the switched filter may utilize one or more varactors to select the desired frequency band.

Finally, the switched filter may be implemented using low temperature co-fired ceramic technology. Such a technique is described in the article entitled "Multilayer, Low-Fire, Ceramic Substrates Sport Embedded Components, New Packaging Solutions" by Lee Goldberg, published in Electronic Design on Jun. 13, 1995 and the article entitled "National Fires Wireless Push With Ceramic Tech" by A. Bindra et al, published in Electronic Engineering Times on Sept. 4, 1995.

What has been described is merely illustrative of the application of the principles of the present invention. Other arrangements and methods can be implemented by those skilled in the art without departing from the spirit and scope of the present invention.

It is claimed:

1. A wireless receiver comprising
   a switched filter, operable under control of a control signal, for selecting one of a plurality of contiguous frequency sub-bands within the continuous bandwidth of a received modulated radio signal band;
   a single frequency synthesizer for producing a local oscillator signal selected using said control signal;
   a single stage mixer for mixing the selected frequency sub-band of the received radio signal with the selected local oscillator signal to produce one modulated fixed intermediate frequency (IF) signal; and
   a detector for detecting the modulated IF signal to recover a baseband signal.

2. The wireless receiver of claim 1 further comprising
   an image-reject filter, connected to the output of the switched filter, for rejecting an image-frequency signal in the selected frequency sub-band.

3. The wireless receiver of claim 1 further comprising
   a low-noise amplifier for receiving the modulated radio signal and outputting it to the image-reject filter or the mixer.

4. The wireless receiver of claim 1 further comprising
   an IF filter for filtering the modulated IF signal from the mixer to have a predetermined bandwidth and sending the filtered modulated IF signal to the detector.

5. The wireless receiver of claim 3 wherein the detector includes
   an analog I/Q demodulator for converting a modulated IF signal to an analog baseband signal and
   an analog-to-digital converter (ADC) for converting the analog baseband signal to a digital baseband signal.

6. The wireless receiver of claim 3 wherein the detector includes
   an analog-to-digital converter (ADC) for converting an analog modulated IF signal to a digital modulated IF signal and
   digital baseband receiver for demodulating the digital modulated IF signal into the baseband signal.

7. The wireless receiver of claim 5 wherein the frequency of the modulated IF signal is less than one-half of the sampling frequency of the ADC.

8. The wireless receiver of claim 1 wherein the mixer is an image rejection mixer.

9. The wireless receiver of claim 1 wherein the switched filter includes a multiple section filter having at least one switchable section.

10. The wireless receiver of claim 1 wherein the switched filter includes a multiple section filter having at least one switchable section and selected from a group of multiple section filters consisting of a 3-order elliptic filter, a 3-order Butterworth filter, and a 3-order Chebychev filter.

11. The wireless receiver of claim 1 wherein the switched filter includes a multiple section filter having at least one tunable section including a varactor for selecting a desired sub-band.

12. The wireless receiver of claim 1 wherein the switched filter is selected from a group of switched filters consisting of a plurality of switched Surface Acoustic Wave (SAW) devices, a plurality of switched ceramic filter devices, a plurality of switched dielectric filter devices, and a plurality of switched thin film resonator devices.

13. The wireless receiver of claim 1 wherein the switched filter is implemented using multi-chip module technology.

14. The wireless receiver of claim 1 wherein the switched filter is implemented using a low temperature co-fired ceramic technology.

15. The wireless receiver of claim 1 being part of a wireless transceiver and wherein the switched filter is shared with a wireless transmitter portion of the transceiver.

16. A method of operating a wireless receiver comprising the steps of selecting, using a switched filter operable under control of a control signal, one of a plurality of contigious frequency sub-band within the bandwidth of a received modulated radio signal band;

producing a predetermined local oscillator signal selected using said control signal which when mixed with a carrier signal associated with the selected switched filter produces one modulated fixed intermediate frequency (IF) signal;

mixing, in a single stage mixer, the selected frequency band of the received modulated radio signal with the selected local oscillator signal to produce the modulated IF signal; and detecting the modulated IF signal to recover a baseband signal.

* * * * *